United States Patent
Wu et al.

(10) Patent No.: US 10,510,588 B2
(45) Date of Patent: Dec. 17, 2019

(54) INTERCONNECTION STRUCTURE AND MANUFACTURING METHOD THEREOF

(71) Applicant: TAIWAN SEMICONDUCTOR MANUFACTURING COMPANY LIMITED, Hsin-Chu (TW)

(72) Inventors: Chung-Wen Wu, Zhubei (TW); Shiu-Ko Jangjian, Tainan (TW); Chien-Wen Chiu, Tainan (TW); Chien-Chung Chen, Kaohsiung (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 0 days.

(21) Appl. No.: 15/830,142

(22) Filed: Dec. 4, 2017

(65) Prior Publication Data

US 2018/0102283 A1    Apr. 12, 2018

Related U.S. Application Data

(63) Continuation of application No. 15/145,369, filed on May 3, 2016, now Pat. No. 9,837,306.

(Continued)

(51) Int. Cl.
*H01L 21/768* (2006.01)
*H01L 23/522* (2006.01)
*H01L 23/532* (2006.01)

(52) U.S. Cl.
CPC .. *H01L 21/76831* (2013.01); *H01L 21/76807* (2013.01); *H01L 21/76832* (2013.01); *H01L 21/76834* (2013.01); *H01L 21/76843* (2013.01); *H01L 21/76877* (2013.01); *H01L 23/5226* (2013.01); *H01L 23/53238* (2013.01); *H01L 21/76829* (2013.01)

(58) Field of Classification Search
CPC .............. H01L 21/76829; H01L 21/76832
USPC ................................ 438/625; 257/758
See application file for complete search history.

(56) References Cited

U.S. PATENT DOCUMENTS 5,525,542 A * 6/1996 Maniar ............. H01L 21/0276
                                                    148/DIG. 113
5,702,981 A * 12/1997 Maniar ............. H01L 21/76802
                                                     257/E21.577

(Continued)

FOREIGN PATENT DOCUMENTS

CN    101842744 A    9/2010
CN    101859727 A    10/2010

(Continued)

OTHER PUBLICATIONS

Corresponding Taiwanese Patent Application 1st Office Action dated Apr. 25, 2017 (5 pgs), CN102194739A.

*Primary Examiner* — George R Fourson, III
(74) *Attorney, Agent, or Firm* — Cooper Legal Group, LLC

(57) ABSTRACT

An interconnection structure includes a first dielectric layer, a bottom conductive feature present in the first dielectric layer, a second dielectric layer present on the first dielectric layer, an aluminum-containing etch stop layer present between the first dielectric layer and the second dielectric layer, an upper conductive via present at least in the second dielectric layer and electrically connected to the bottom conductive feature, and at least one aluminum-containing fragment present at least at a bottom corner of the upper conductive via.

20 Claims, 7 Drawing Sheets

Related U.S. Application Data

(60) Provisional application No. 62/270,468, filed on Dec. 21, 2015.

(56) References Cited

U.S. PATENT DOCUMENTS

| | | | | |
|---|---|---|---|---|
| 6,372,653 | B1* | 4/2002 | Lou | H01L 21/76811 257/E21.579 |
| 6,492,272 | B1* | 12/2002 | Okada | G03F 7/427 134/1.2 |
| 6,586,842 | B1* | 7/2003 | You | H01L 21/76804 257/758 |
| 8,216,745 | B2 | 7/2012 | Kageyama et al. | |
| 9,515,021 | B1* | 12/2016 | Chen | H01L 21/76802 |
| 2002/0140103 | A1* | 10/2002 | Kloster | H01L 21/76801 257/767 |
| 2004/0180538 | A1* | 9/2004 | Rich | H01L 21/02063 438/637 |
| 2005/0095869 | A1* | 5/2005 | Tao | H01L 21/31116 438/724 |
| 2005/0266683 | A1* | 12/2005 | Lee | C23F 1/34 438/638 |
| 2006/0024941 | A1* | 2/2006 | Son | H01L 21/76808 438/597 |
| 2008/0096290 | A1* | 4/2008 | Smith | H01L 43/12 438/3 |
| 2009/0142931 | A1* | 6/2009 | Wang | H01L 21/02063 438/734 |
| 2010/0013098 | A1* | 1/2010 | Besling | H01L 21/76823 257/751 |
| 2010/0252930 | A1 | 10/2010 | Liao et al. | |
| 2010/0261096 | A1 | 10/2010 | Kageyama et al. | |
| 2012/0256324 | A1 | 10/2012 | Liao et al. | |
| 2013/0214391 | A1* | 8/2013 | Choi | H01L 21/76816 257/622 |
| 2014/0190933 | A1* | 7/2014 | Deshpande | H01L 43/12 216/17 |
| 2014/0212993 | A1* | 7/2014 | Deshpande | H01L 43/12 438/3 |
| 2014/0264641 | A1* | 9/2014 | Frohberg | H01L 29/4175 257/412 |
| 2014/0264895 | A1 | 9/2014 | Sung et al. | |
| 2015/0048488 | A1* | 2/2015 | Peng | H01L 23/53295 257/637 |
| 2016/0111325 | A1* | 4/2016 | Jangjian | H01L 23/53238 257/774 |
| 2016/0133512 | A1* | 5/2016 | Lee | H01L 21/76807 438/666 |
| 2016/0240428 | A1* | 8/2016 | Tung | H01L 21/7682 |
| 2016/0372413 | A1* | 12/2016 | Mahalingam | H01L 21/31144 |
| 2017/0162430 | A1* | 6/2017 | Dai | H01L 21/76802 |

FOREIGN PATENT DOCUMENTS

| | | |
|---|---|---|
| CN | 102194739 A | 9/2011 |
| CN | 104051256 A | 9/2014 |
| TW | 489420 | 6/2002 |
| TW | 201532226 A | 8/2015 |

* cited by examiner

INTERCONNECTION STRUCTURE AND MANUFACTURING METHOD THEREOF

RELATED APPLICATIONS

This application is a continuation of and claims priority to U.S. Non-Provisional application Ser. No. 15/145,369, titled "INTERCONNECTION STRUCTURE AND MANUFACTURING METHOD THEREOF" and filed on May 3, 2016, which claims priority to U.S. Provisional Application Ser. No. 62/270,468, titled "BACK END OF LINE (BEOL) VIA STRUCTURE" and filed on Dec. 21, 2015. U.S. Non-Provisional application Ser. No. 15/145,369 and U.S. Provisional Application Ser. No. 62/270,468 are incorporated herein by reference.

BACKGROUND

The semiconductor integrated circuit (IC) industry has experienced rapid growth. Modern integrated circuits are made up of literally millions of active devices such as transistors and capacitors. Technological advances in IC materials and design have produced generations of ICs where each generation has smaller and more complex circuits than the previous generation. These devices are initially isolated from each other, but are later interconnected together through multiple metal layers to form functional circuits. As the IC becomes increasingly more complex, the interconnect structure also becomes more complex, resulting in increasing number of metal layers.

Interconnect structures may include lateral interconnections, such as metal lines (wirings), and vertical interconnections, such as conductive vias and contacts. However, complex interconnects limit performance and the density of modern integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
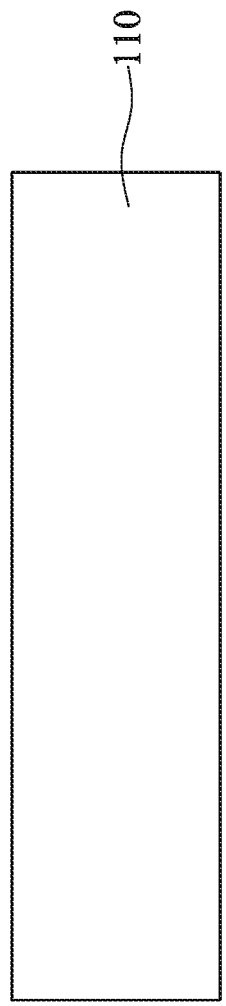
FIG. 1A to FIG. 1F different stages of a method of manufacturing an interconnection structure, in accordance with some embodiments of the disclosure.
Figure 1A:
Figure 1A:
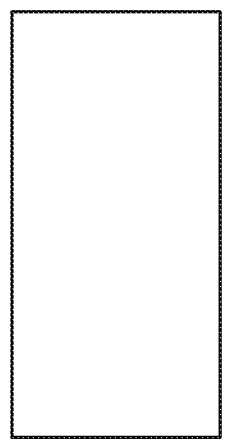

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits contain a plurality of patterned metal lines separated by inter-wiring spacings. Typically, the metal patterns of vertically spaced metallization layers are electrically interconnected by vias. Damascene is an interconnection fabrication process in which openings are formed in an insulating layer and filled with metal to form the metal lines. Metal lines formed in trench-like openings typically extend substantially parallel to the semiconductor substrate. Semiconductor devices of such type, according to current technology, may comprise eight or more levels of metallization layers to satisfy device geometry and micro-miniaturization requirements. As semiconductor device sizes continue to shrink, there are some challenges in interconnection structures. Since these metallic films are thin, they have high resistance, thereby causing increased resistance in the interconnection structure and increased RC delay, especially in small, narrow features.

Reference is made to FIG. 1A to FIG. 1F, which are different stages of a method of manufacturing an interconnection structure, in accordance with some embodiments of the disclosure. Referring to FIG. 1A, an opening 112 is formed in a dielectric layer 110. The dielectric layer 110 is formed over a semiconductor substrate (not shown). The semiconductor substrate may be a semiconductor material and may include known structures including a graded layer or a buried oxide, for example. In some embodiments, the substrate includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate. Alternatively, the substrate may be an active layer of a semiconductor-on-insulator (SOI) substrate or a multi-layered structure such as a silicon-germanium layer formed on a bulk silicon layer. Integrated circuits such as PMOS and NMOS transistors (not shown) may be formed on the top surface of the substrate.

In some embodiments, the dielectric layer 110 is an inter-metal dielectric (IMD) having a low dielectric constant value (k value), for example, lower than about 3.5. The dielectric layer 110 may comprise dielectric materials, such as silicon oxide, silicon nitride, silicon oxy-nitride, or other suitable material.

In some embodiments, there is a plurality of the openings 112 formed in the dielectric layer 110. The opening 112 may be formed, for example, by forming a patterned photoresist layer (not shown) over the dielectric layer 110 and using a dry etch processing step to remove portions of the dielectric layer 110 to define the opening 112 by using the patterned photoresist layer (not shown) as a mask. Various suitable dry etch processes may be used. After the dry etch processing step, the patterned photoresist layer (not shown) is removed by, for example, a photolithographic removal process.

Figure 1B:
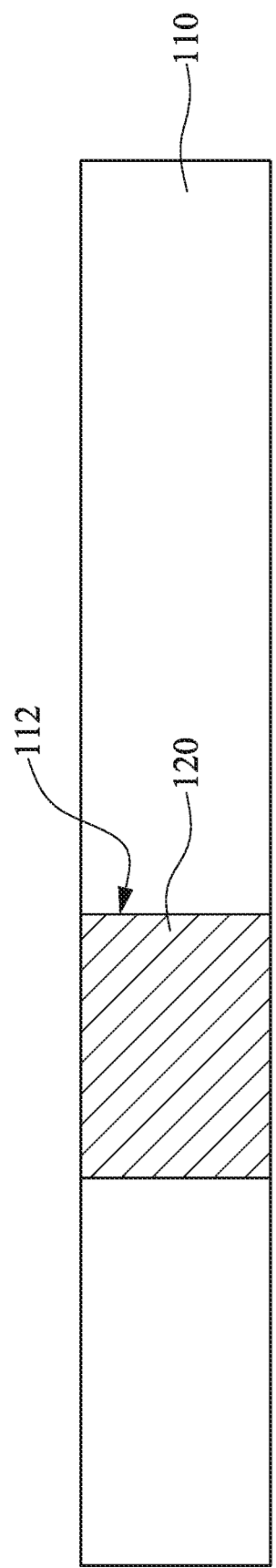

Referring to FIG. 1B, a conductive feature 120 is formed in the opening 112. The process of forming the conductive feature 120 includes forming a conductive layer filling the opening 112 and on the dielectric layer 110, and then removing the excess portion of the conductive layer (not shown) that has accumulated over the surface of the dielectric layer 110, such that the conductive feature 120 is present in the opening 112.

The conductive layer can be a metal layer. The material of conductive layer may include copper or copper alloys, or other suitable conductive materials, such as silver, gold, tungsten, aluminum, and the like. The conductive layer can be formed by a deposition process. The removing process can be any suitable planarization process, such as a chemical mechanical polishing (CMP). The chemical mechanical process is performed to level the surface of conductive feature 120 and the dielectric layer 110. The conductive feature 120 can be a conductive line, which may be the first or any subsequent metal interconnect level of the semiconductor device.

In some embodiments, because copper diffuses easily into some dielectric materials, especially some types of low-k dielectric materials, a diffusion barrier layer (not shown) is optionally deposited over inside surfaces of opening 112 and over the surface of the dielectric layer 110 before the conductive layer is formed. The diffusion barrier layer can be deposited using methods of such as CVD or PVD, to a thickness of between about 50 and 300 angstrom. The metal barrier material of the diffusion barrier layer 122 includes Ta, TaN or TiN.

Figure 1C:
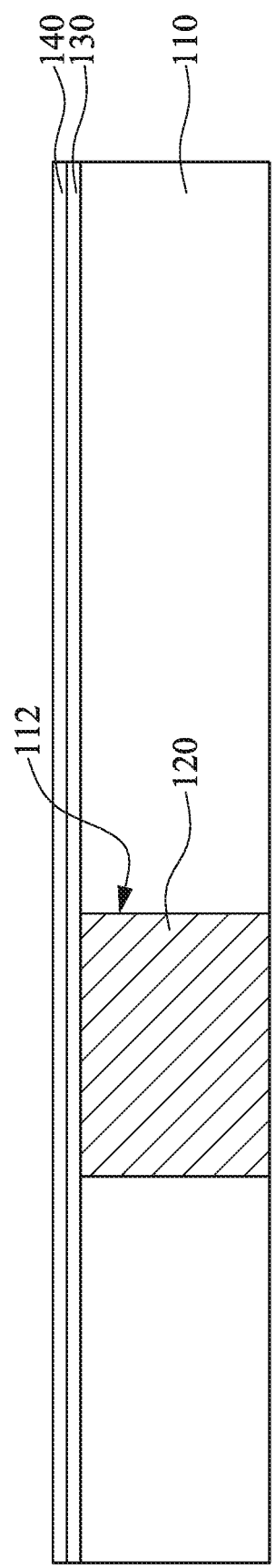

Referring to FIG. 1C, at least one etch stop layer is formed on the dielectric layer 110 and on the conductive feature 120. In some embodiments, a lower etch stop layer 130 is formed on the dielectric layer 110 and on the conductive feature 120, and then an upper etch stop layer 140 is optionally formed on the lower etch stop layer 130. The lower etch stop layer 130 and the upper etch stop layer 140 are made of different material. The lower etch stop layer 130 and the upper etch stop layer 140 can be formed by a series of deposition processes. The deposition process can be such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

The lower etch stop layer 130 is a low capacitance material to improve RC delay. In some embodiments, the lower etch stop layer 130 is an aluminum-containing layer. The material of the lower etch stop layer 130 can be, for example, aluminum nitride, aluminum oxynitride, aluminum carbide, or combinations thereof. If depositing an aluminum nitride layer as the lower etch stop layer 130, the layer can be formed by reactive sputtering (RS) with an aluminum target in a nitrogen atmosphere. The lower etch stop layer 130 is formed on the dielectric layer 110 and serves as an etch stop for continued, back-end-of-line (BEOL) metallization. The thickness of the lower etch stop layer 130 is a thin layer and is in a range from 5 to 50 angstroms. One skilled in the art will realize, however, that the dimensions recited throughout the description are merely examples, and will change if different formation technologies are used.

The upper etch stop layer 140 is made of material different from the lower etch stop layer 130. In some embodiments, the upper etch stop layer 140 is an aluminum free layer. The upper etch stop layer 140 may have a dielectric constant lower than about 4.0, or even lower than about 3.5, and may comprise a material selected from nitrogen doped (silicon) carbide (SiC:N, also known as NDC), oxygen doped (silicon) carbide (SiC:O, also known as ODC), and combinations thereof. The reaction gases (precursors) depend on the desired composition of etch stop layer, and may include silicon (Si), carbon (C), hydrogen (H), nitrogen (N), oxygen (O), boron (B), and/or the like. Inactive gases, such as He, $N_2$, Ar, Xe, and the like may be used as ambient gases. If ODC is to be formed, $CO_2$ may also be added to provide oxygen. If NDC is to be formed, $NH_3$ may be added to provide nitrogen. The thickness of the upper etch stop layer 140 is in a range from 30 to 1000 angstroms. One skilled in the art will realize, however, that the dimensions recited throughout the description are merely examples, and will change if different formation technologies are used.

The upper etch stop layer 140 may be formed in-situ with the formation of lower etch stop layer 130, which means that lower etch stop layer 130 and upper etch stop layer 140 are formed in a same process chamber. The deposition of lower etch stop layer 130 and upper etch stop layer 140 may both be performed at elevated temperatures, for example, between about 100° C. and about 500° C.

Figure 1D:
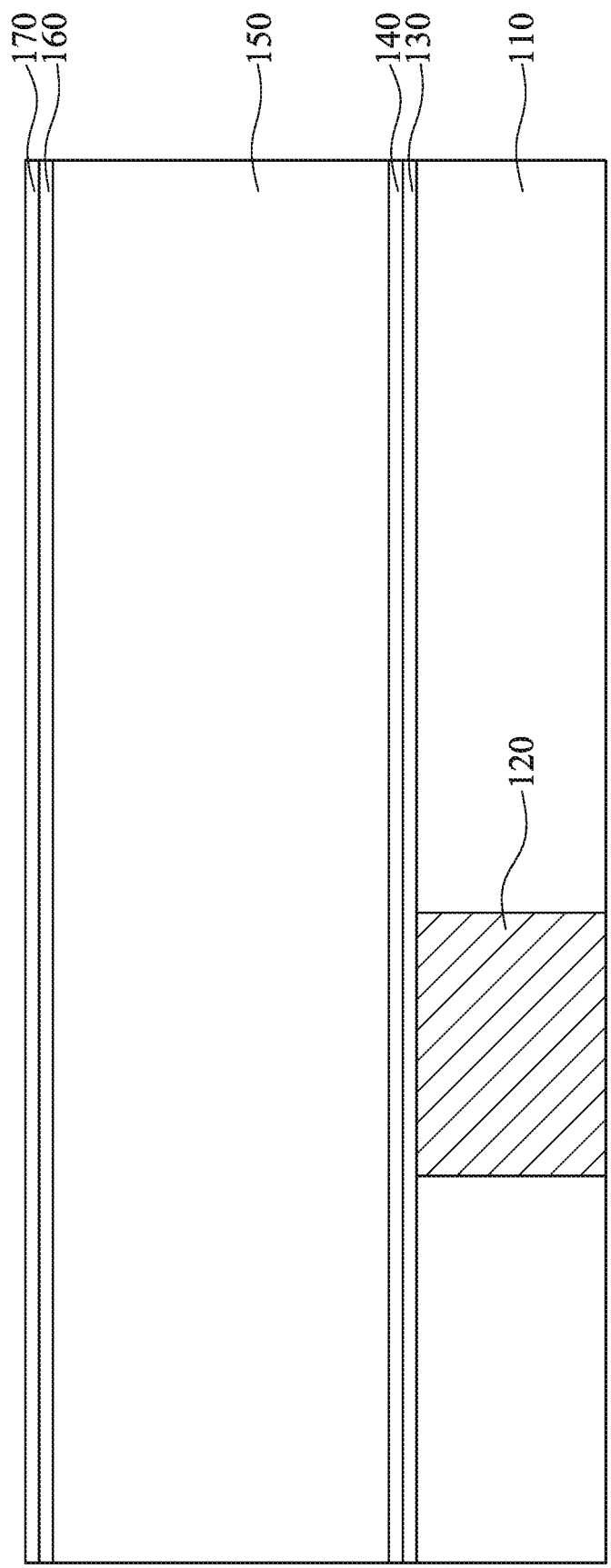

Referring to FIG. 1D, an additional dielectric layer 150 is formed on the upper etch stop layer 140. The dielectric layer 150 can be an inter-metal dielectric (IMD) layer. The dielectric layer 150 may be a single layer or a multi-layered structure. The thickness of the dielectric layer 150 varies with the applied technology, for example a thickness of about 1000 angstroms to about 30000 angstroms. One skilled in the art will realize, however, that the dimensions recited throughout the description are merely examples, and will change if different formation technologies are used.

In some embodiments, the dielectric layer 150 is an oxygen-containing dielectric layer. The dielectric layer 150 may be formed of $SiO_2$, carbon-doped $SiO_2$, a comparatively low dielectric constant (k value) dielectric material with a k value less than about 4.0, or combinations thereof. The dielectric layer 150 may be formed of a low-k dielectric material, an extreme low-k dielectric material, a porous low-k dielectric layer, or combinations thereof. The term "low-k" is intended to define a dielectric constant of a dielectric material of 3.0 or less. The term "extreme low-k (ELK)" means a dielectric constant of 2.5 or less. The term "porous low-k" refers to a dielectric constant of a dielectric material of 2.0 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. The dielectric layer 150 is deposited through any of a variety of techniques, such as CVD, PVD, ALD, RPECVD, LSMCD, coating, spin-coating or another process that is adapted to form a thin film layer over the substrate.

An anti-reflective coating (ARC) layer 160 and a cap layer 170 may be optionally deposited on the dielectric layer 150. The anti-reflective coating layer 160 can be a nitrogen free anti-reflective coating layer (NFARL), and the cap layer 170 can be a titanium nitride (TiN) layer, or a tantalum nitride (TaN) layer. The anti-reflective coating layer 160 and the cap layer 170 can be formed by any suitable deposition process. In some embodiments, the composite of the anti-reflective coating layer 160 and the cap layer 170 is regarded as a barrier and anti-reflective coating (BARC) layer. In some other embodiments, the cap layer 170 is usable as an etch stop for later processing in forming the semiconductor device.

Figure 1E:
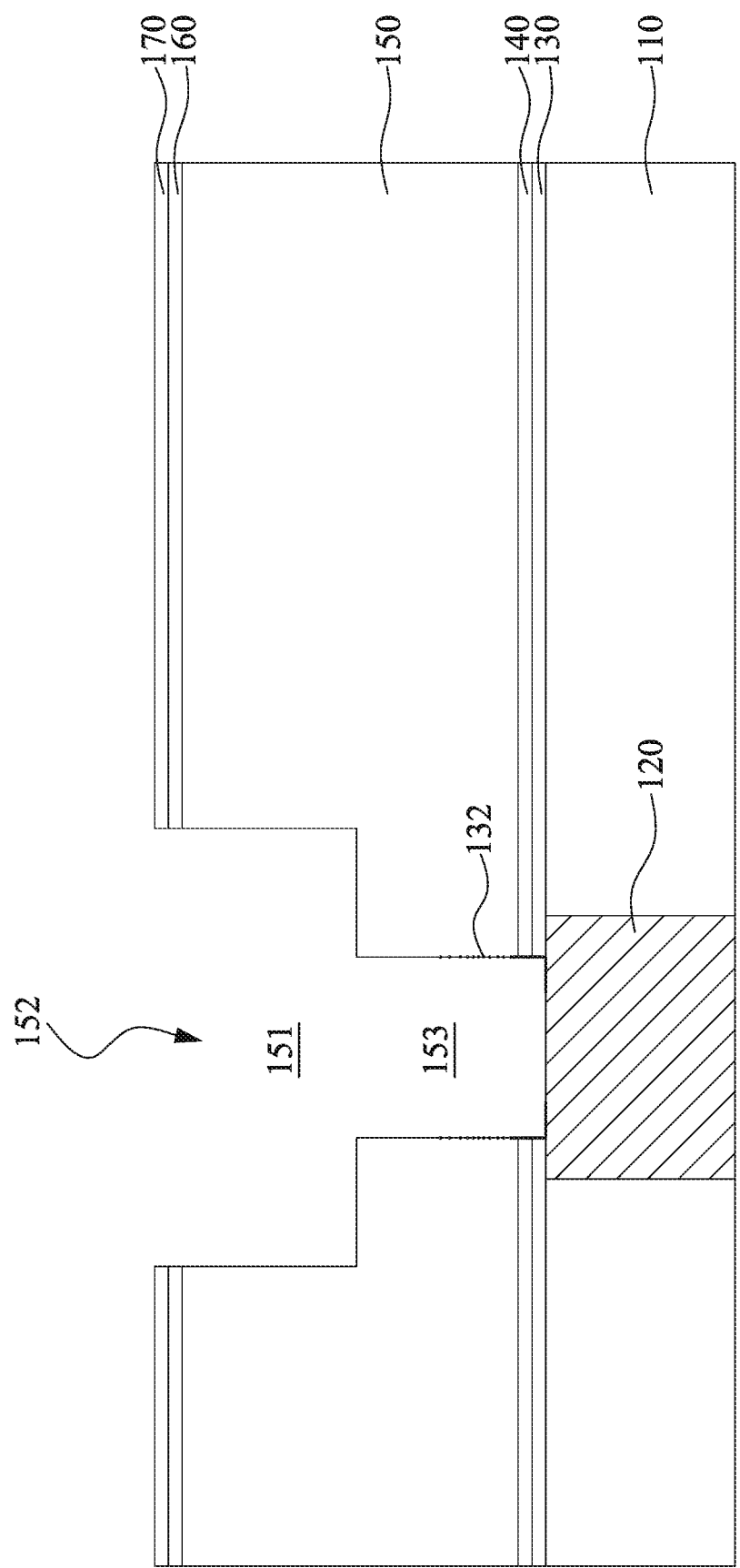

Referring to FIG. 1E, a hole 152 is formed in the structure above. The hole 152 can be an exemplary dual damascene opening including an upper trench section 151 and a lower via-hole section 153 patterned in the structure to define a contact region in the substrate. In dual damascene techniques including a "via-first" patterning method or a "trench-first" patterning method, the upper trench section 151 and the lower via-hole section 153 may be formed using a typical lithographic with masking technologies and anisotropic etch operation (e.g. plasma etching or reactive ion etching).

For example, the upper trench section 151 may be formed using a first masking layer (not shown) along with a suitable etching process. The masking layer may be a hardmask including silicon nitride formed through a process such as a CVD process, although other materials, such as oxides, oxynitrides, silicon carbide, combinations of these, or the like, and other processes, such as PECVD, LPCVD, or even silicon oxide formation followed by nitridation, may alternatively be utilized. Once formed, the masking layer may be patterned through a suitable photolithographic process to expose those portions of the underlying layers that will be removed to form the upper trench section 151. The upper trench section 151 may be formed by performing a dry etching process, such as plasma etching or reactive ion etching. A middle etch stop layer may be optionally deposited intermediately in the dielectric layer 150 to provide a clear indicator of when to end a particular etching process. The masking layer is removed after the upper trench section 151 is formed.

The dielectric layer 150 under the upper trench section 151 is patterned to form lower via-hole section 153 under the upper trench section 151. For example, the portion of aside the predetermined position of the upper trench section 151 is once again protected by another masking layer. Thus the portion of the dielectric layer 150 for forming the lower via-hole section 153 is exposed from the masking layer. The exposed portion of the dielectric layer 150 is removed by a dry etching process, such as plasma etching or reactive ion etching. The lower via-hole section 153 has higher aspect ratio than that of the upper trench section 151, the width of the lower via-hole section 153 is smaller than the width of the upper trench section 151. The masking layer is removed after the lower via-hole section 153 is formed.

The hole 152 is formed penetrating the dielectric layer 150, the anti-reflective coating layer 160, the cap layer 170, the upper etch stop layer 140, and the lower etch stop layer 130. Therefore, the conductive feature 120 is exposed from the hole 152. Although the embodiment illustrates dual damascene openings in the dielectric layer 150, the use of single damascene openings in the dielectric layer 150 also provide values.

Since the hole 152 is formed by performing one or more dry etching process, layers above are exposed to a bombardment of ions (e.g. a plasma of reactive gases such as fluorocarbons, oxygen, chlorine). The materials of the layers are dislodged from the exposed surface and are resputtered onto the sidewall of the hole 152. For example, the lower etch stop layer 130 is an aluminum-containing layer, which is a low capacitance material to improve RC delay of the interconnection structure. The aluminum is light and has good binding ability to the dielectric material. Therefore, some aluminum-containing fragments 132, which are from the dislodged material of the lower etch stop layer 130, are present at the bottom portion of the sidewall of the hole 152, such as at the bottom portion of the lower via-hole section 153. Namely, a portion of the lower etch stop layer 130 is knocked out by the ions during the dry etching process and becomes aluminum-containing fragments 132, and a portion of the aluminum-containing fragments 132 is adhered at the sidewall of the dielectric layer 150 and at the bottom corner of the hole 152.

The distribution of the aluminum-containing fragments 132 on the sidewall and the bottom corner of the hole 152 is corresponding to the distance from the conductive feature 120. For example, the aluminum-containing fragments 132 have greater density at the bottom portion of the sidewall of the hole 152, and the density of the aluminum-containing fragments 132 is decreased with the increasing distance from the conductive feature 120. In some embodiments, the aluminum-containing fragments 132 may have the greatest density at the corner between the dielectric layer 150 and the conductive feature 120.

Figure 1F:
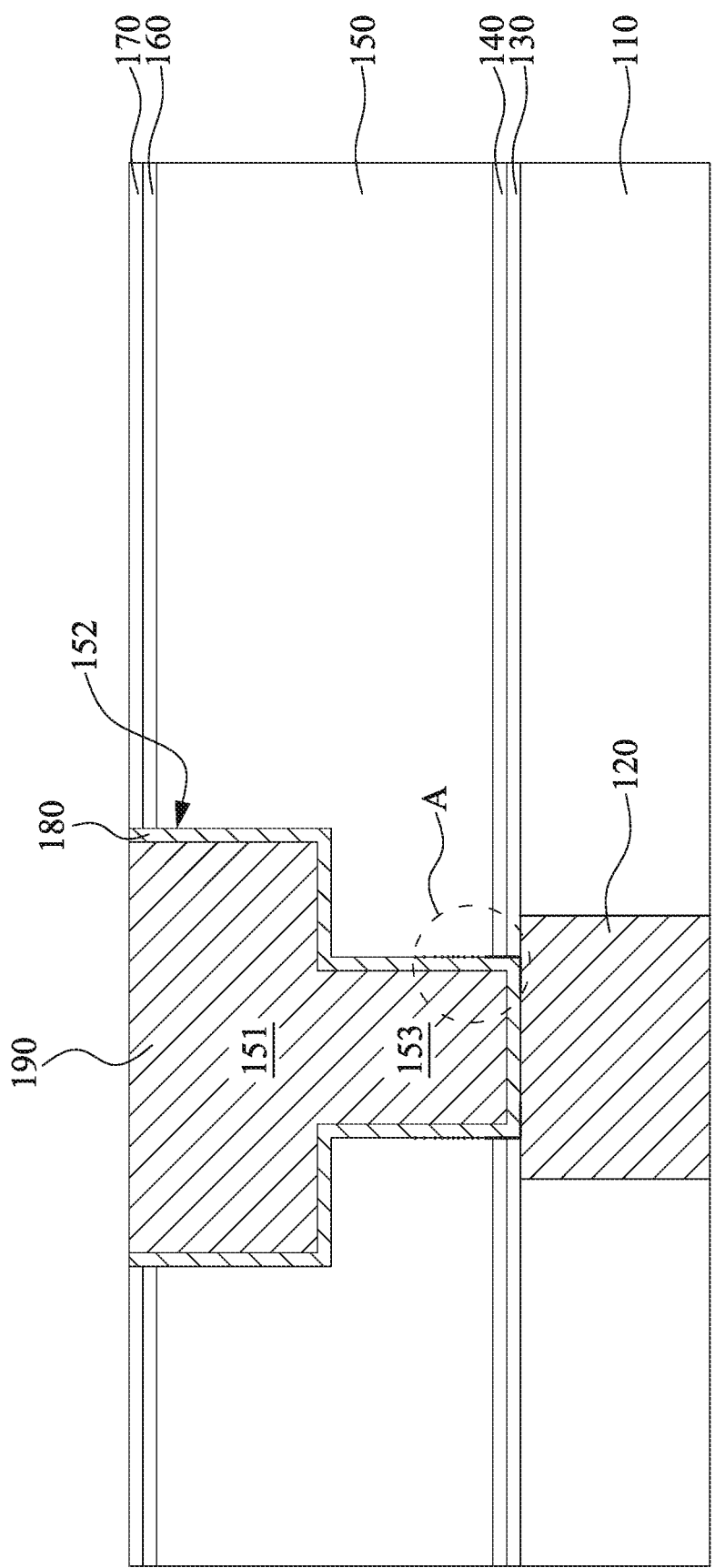

Referring to FIG. 1F, a barrier layer 180 is formed on the sidewall of the hole 152. The barrier layer 180 is deposited over inside surfaces of hole 152 and over the surface of the dielectric layer 150. The barrier layer 180 can be deposited using methods of such as CVD or PVD, to a thickness of between about 50 and 300 angstrom. For the use as an interconnect medium, copper has increasingly gained acceptance and is increasingly being used for this purpose. Copper is known to have low cost and a low resistivity; copper however has a relatively large diffusion coefficient into dielectric material such as silicon dioxide and silicon. The barrier layer 180 is utilized for preventing following deposited conductive metal, such as copper or copper alloy from diffusing into the dielectric layer 150. The barrier layer 180 is made of a substantially aluminum free material. The metal barrier material of the barrier layer 180 includes Ta, TaN or TiN.

In some embodiments, a thin seed layer is optionally formed on the barrier layer 180. The seed layer has a thickness of about 100 angstroms to about 1000 angstroms. The seed layer is a metal alloy layer containing at least a main metal element, e.g., copper (Cu), and a first additive metal element, e.g., manganese (Mn). In other embodiments, Ti, Nb, Cr, V, Y, Tc, Re, or the like can be utilized as another additive metal for forming the seed layer. The seed layer may be deposited by using physical vapor deposition (PVD), chemical vapor deposition (CVD), plasma enhanced CVD (PECVD), low pressure CVD (LPCVD), or other well-known deposition techniques. The seed layer is utilized for improving the quantity of the following deposition process.

The hole 152, such as the dual damascene opening, is filled with a conductive material. An electrochemical copper deposition (ECD) is carried out to form a conductive layer 190 on the barrier layer 180 (or on the seed layer) and fill the hole 152. The hole 152 including the upper trench section 151 and the lower via-hole section 153 is filled with the conductive material. The conductive layer 190 can be a metal layer. The material of conductive layer 190 may include copper or copper alloys, or other suitable conductive materials, such as silver, gold, tungsten, and the like. In some embodiments, the conductive layer 190 is made of a substantially aluminum free material. The barrier layer 180 may function as a protector to prevent the conductive layer 190 diffusing into the dielectric layer 150. The electrochemical copper deposition has been adopted for copper metallization because of its larger grain size (good electromigration) and high deposition rates. However, the electrochemical copper deposition process, such as electrochemical plating, is a wet process and causes void formation in the hole 152. Also, the electrolyte can also be trapped in the voids causing reliability problems.

In addition, after the formation of the conductive layer 190, a thermal treatment, for example an annealing process, is performed on above structure. In some embodiments, the step of thermal treatment is provided at the time immediately after the formation of the conductive layer 190. In some other embodiment, the step of thermal treatment is provided at the time immediately after the step of CMP of removing the excess portions of the conductive layer 190 outside the hole 152. The temperature of the annealing process can be ranged from about 50 to 400° C. The duration of the annealing process may be ranged from about 5 to 60 minutes.

Figure 2:
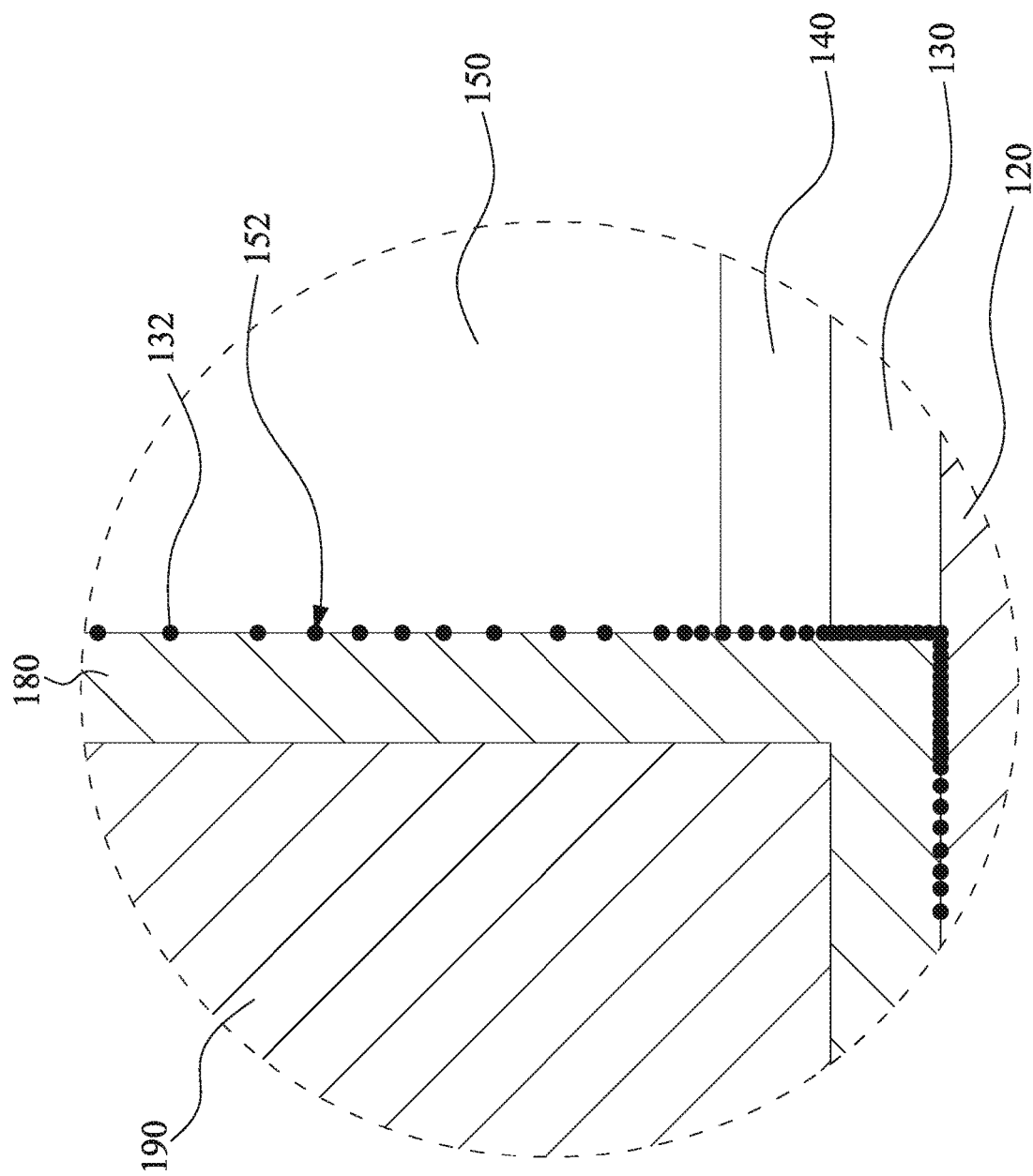
FIG. 2 is an enlarged view of the portion A in FIG. 1F, in accordance with some embodiments of the disclosure.

After the conductive layer 190 is formed filling the hole 152, a chemical mechanical polishing process is performed to remove the excess portions of the conductive layer 190, and the barrier layer 180 outside the hole 152, thus exposing the top surface of the cap layer 170 and achieving a planarized surface. The remaining conductive layer 190 in the hole 152 is regarded as a conductor (referring as conductor 190 hereafter). The hole 152 and conductor 190 therein is regarded as a conductive via for interconnection to the conductive feature 120. In some embodiments, the aluminum-containing fragments 132 are present at least at a bottom corner of the conductive via. In some embodiments, the sidewall of the conductive via has a bottom portion and a middle portion, the bottom portion is closer to the lower etch stop layer 130 than the middle portion, and the density of the aluminum-containing fragments 132 on the bottom portion of the sidewall of the conductive via is greater than that on the middle portion of the sidewall of the conductive via. Referring to both FIG. 2 and FIG. 1F, in which FIG. 2 is an enlarged view of the portion A in FIG. 1F, in accordance with some embodiments of the disclosure. The conductor 190 after the annealing and planarization, e.g., chemical mechanical polishing, has a lower resistance and better electromigration lifetimes. However, not only the electrochemical copper deposition process may form void in the conductor 190, but also the anneal process results in void formation. The stresses during the anneal process deform the conductor 190 and cause additional void formed at the interface between the conductor 190 and the barrier layer 180. The existence of the voids may reduce the volume of the conductive material in the hole 152 thereby increasing the resistance of the conductor 190, which may also increase the RC delay of the semiconductor device.

In some embodiments of the disclosure, the etch stop layer for BOEL, such as the lower etch stop layer 130 is made of low capacitance material which may improve RC delay. Since the via is formed by dry etching process, a portion of the etch stop layer is bombed by ions and is dislodged from the exposed surface and may adhere on the sidewall and at the corner of the via. In some embodiments, the low capacitance material for the etch stop layer is an aluminum-containing material, such as aluminum nitride, aluminum oxynitride, aluminum carbide, or combinations thereof. The aluminum is light and has good binding ability to the dielectric material. Therefore, some aluminum-containing fragments 132, which are from the dislodged material of the lower etch stop layer 130, are adhered at the bottom portion of the sidewall and at the bottom corner of the hole 152. The aluminum-containing fragments 132 may serve as an additional barrier to prevent the conductor 190 from escaping.

According to some embodiments of the disclosure, an interconnection structure includes a first dielectric layer, a bottom conductive feature present in the first dielectric layer, a second dielectric layer present on the first dielectric layer and having a hole therein, an upper conductor present in the hole and electrically connected to the bottom conductive feature, and a plurality of aluminum-containing fragments present at least partially on at least one sidewall of the hole, wherein a density of the aluminum-containing fragments at the bottom of the sidewall of the hole is greater than that in the middle of the sidewall of the hole.

According to some embodiments of the disclosure, an interconnection structure includes a first dielectric layer, a bottom conductive feature present in the first dielectric layer, a second dielectric layer present on the first dielectric layer, an aluminum-containing etch stop layer present between the first dielectric layer and the second dielectric layer, an upper conductive via present at least in the second dielectric layer and electrically connected to the bottom conductive feature, and at least one aluminum-containing fragment present at least at a bottom corner of the upper conductive via.

According to some embodiments of the disclosure, A method of manufacturing an interconnection structure, the method includes forming a bottom conductive feature in a first dielectric layer; forming an aluminum-containing etch stop layer on the bottom conductive feature and the first dielectric layer; forming a second dielectric layer on the aluminum-containing etch stop layer; and etching the second dielectric layer and the aluminum-containing etch stop layer to form a hole in the second dielectric layer and the aluminum-containing etch stop layer, wherein the bottom conductive feature is at least partially exposed by the hole, and the etching the aluminum-containing etch stop layer resputters at least one aluminum-containing fragment onto at least one sidewall of the hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnection structure, comprising:
   a conductive feature;
   a first dielectric layer in contact with a sidewall of the conductive feature;
   a first etch stop layer comprising a metal, wherein the first etch stop layer overlies the first dielectric layer and the conductive feature;
   a second etch stop layer, wherein the first etch stop layer and the second etch stop layer comprise different materials;
   a second dielectric layer overlying the first etch stop layer, wherein the second etch stop layer is disposed between the first etch stop layer and the second dielectric layer;
   a conductor present between a first portion of the second dielectric layer and a second portion of the second dielectric layer; and
   a plurality of fragments comprising the metal and present on a sidewall of the first portion of the second dielectric layer facing the conductor, wherein a density of the fragments decreases with an increasing distance from the conductive feature.

2. The interconnection structure of claim 1, comprising:
a barrier layer disposed between the conductor and the sidewall of the first portion of the second dielectric layer, wherein the plurality of fragments are disposed between the sidewall of the first portion of the second dielectric layer and the barrier layer.

3. The interconnection structure of claim 1, comprising:
a barrier layer disposed between the conductor and the sidewall of the first portion of the second dielectric layer and between the conductor and the first etch stop layer.

4. The interconnection structure of claim 1, wherein:
the metal is aluminum, and
the second etch stop layer is aluminum free.

5. An interconnection structure, comprising:
a conductive feature;
a first dielectric layer in contact with a sidewall of the conductive feature;
a first etch stop layer comprising metal, wherein the first etch stop layer overlies the first dielectric layer and the conductive feature;
a second etch stop layer;
a second dielectric layer overlying the first etch stop layer, wherein the second etch stop layer is between the first etch stop layer and the second dielectric layer;
a conductor present between a first portion of the first etch stop layer and a second portion of the first etch stop layer and between a first portion of the second dielectric layer and a second portion of the second dielectric layer;
at least one fragment of the metal present on a sidewall of the first portion of the second dielectric layer facing the conductor; and
at least one other fragment of the metal present on a sidewall of the second etch stop layer facing the conductor.

6. A method of manufacturing an interconnection structure, comprising:
forming an opening in a first dielectric layer;
forming a conductive feature in the opening;
forming a first etch stop layer comprising metal over the first dielectric layer;
forming a second dielectric layer over the first etch stop layer;
forming a layer over the second dielectric layer; and
etching the layer, the second dielectric layer, and the first etch stop layer to form a hole defined by a sidewall of the layer, a sidewall of the second dielectric layer, and a sidewall of the first etch stop layer, wherein etching the first etch stop layer resputters at least one fragment of the metal onto the sidewall of the second dielectric layer.

7. The method of claim 6, comprising:
forming a diffusion barrier layer in the opening before forming the conductive feature in the opening.

8. The method of claim 6, comprising:
forming a second etch stop layer over the first etch stop layer, wherein the first etch stop layer and the second etch stop layer are made of different materials.

9. The method of claim 8, wherein:
the first etch stop layer is in contact with the second etch stop layer, and
the second etch stop layer is in contact with the second dielectric layer.

10. The method of claim 6, comprising:
forming a second etch stop layer over the first etch stop layer, wherein:
the metal of the first etch stop layer is aluminum, and
the second etch stop layer is aluminum free.

11. The method of claim 6, wherein:
the conductive feature underlies the first etch stop layer, and
etching the second dielectric layer and the first etch stop layer comprises:
etching the second dielectric layer and the first etch stop layer to expose the conductive feature.

12. The method of claim 6, wherein etching the second dielectric layer and the first etch stop layer comprises:
etching the second dielectric layer and the first etch stop layer using a dry etching process that comprises utilizing a bombardment of ions.

13. The method of claim 6, wherein resputtering at least one fragment of the metal comprises:
resputtering a plurality of fragments of the metal onto the sidewall of the second dielectric layer, wherein a density of fragments along the sidewall of the second dielectric layer decreases with an increasing distance from the first etch stop layer.

14. The method of claim 6, comprising forming a barrier layer in the hole, wherein the at least one fragment of the metal is disposed between the second dielectric layer and the barrier layer.

15. The interconnection structure of claim 5, wherein the first etch stop layer contacts the conductive feature and the first dielectric layer.

16. The interconnection structure of claim 5, comprising a barrier layer in contact with the conductive feature and the first etch stop layer.

17. The interconnection structure of claim 16, wherein the barrier layer is disposed between the conductor and the second etch stop layer and between the conductor and the first etch stop layer.

18. The method of claim 6, wherein the layer comprises an anti-reflective coating layer.

19. The method of claim 18, comprising forming a cap layer over the anti-reflective coating layer, wherein:
the etching comprises etching the cap layer, and
the hole is further defined by a sidewall of the cap layer.

20. The method of claim 6, wherein the forming a conductive feature comprises forming the conductive feature in the opening to contact the first dielectric layer.

* * * * *